United States Patent
Yamazaki et al.

[11] Patent Number: 6,046,469
[45] Date of Patent: Apr. 4, 2000

[54] SEMICONDUCTOR STORAGE DEVICE HAVING A CAPACITOR AND A MOS TRANSISTOR

[75] Inventors: Shinobu Yamazaki, Tenri; Kazuya Ishihara, Souraku-gun; Masaya Nagata, Nara, all of Japan

[73] Assignee: Sharp Kabushiki Kaisha, Osaka, Japan

[21] Appl. No.: 09/161,483

[22] Filed: Sep. 28, 1998

[30] Foreign Application Priority Data

Sep. 29, 1997 [JP] Japan ................................. 9-263319

[51] Int. Cl.$^7$ ................................. H01L 27/108
[52] U.S. Cl. .................. 257/306; 257/295; 257/296; 438/240; 438/396
[58] Field of Search .................. 257/295, 296, 257/303, 306; 438/239, 240, 396

[56] References Cited

U.S. PATENT DOCUMENTS

| | | | |
|---|---|---|---|
| 5,003,428 | 3/1991 | Shepherd | 361/322 |
| 5,005,102 | 4/1991 | Larson | 361/313 |
| 5,053,917 | 10/1991 | Miyasaka et al. | 361/321.5 |
| 5,142,437 | 8/1992 | Kammerdiner et al. | 361/321.1 |
| 5,185,689 | 2/1993 | Maniar | 361/313 |
| 5,335,138 | 8/1994 | Sandhu et al. | 361/303 |
| 5,407,855 | 4/1995 | Maniar et al. | 438/3 |
| 5,555,486 | 9/1996 | Kingon et al. | 361/305 |
| 5,567,964 | 10/1996 | Kashihara et al. | 257/310 |
| 5,622,893 | 4/1997 | Summerfelt et al. | 438/396 |
| 5,701,647 | 12/1997 | Saenger et al. | 438/396 |
| 5,714,402 | 2/1998 | Choi | 438/396 |
| 5,717,236 | 2/1998 | Shinkawata | 257/306 |
| 5,790,366 | 8/1998 | Desu et al. | 361/305 |

FOREIGN PATENT DOCUMENTS

| | | |
|---|---|---|
| 5-343251 | 12/1993 | Japan . |
| 6-326249 | 11/1994 | Japan . |
| 7-94680 | 4/1995 | Japan . |
| 7-99290 | 4/1995 | Japan . |
| 8-51165 | 2/1996 | Japan . |
| 9-45872 | 2/1997 | Japan . |

*Primary Examiner*—Mahshid Saadat
*Assistant Examiner*—George Eckert, II
*Attorney, Agent, or Firm*—Nixon & Vanderhye P.C.

[57] ABSTRACT

In a semiconductor storage device, a capacitor section is connected with a drain region of a MOS transistor by means of a polysilicon plug. The capacitor section has a lower electrode, a ferroelectric thin film, and an upper electrode stacked in this order. A TiN barrier metal is placed between the lower electrode and the plug. The lower electrode has a lower film made of a platinum-rhodium alloy and an upper film made of a platinum-rhodium alloy oxide which is in contact with the ferroelectric thin film.

8 Claims, 2 Drawing Sheets

SEMICONDUCTOR STORAGE DEVICE HAVING A CAPACITOR AND A MOS TRANSISTOR

BACKGROUND OF THE INVENTION

The present invention relates to a semiconductor storage device having a capacitor and a MOS transistor, and more particularly, to a semiconductor storage device whose capacitor has a dielectric film formed of a ferroelectric substance or a high dielectric substance.

At present, DRAMs (Dynamic Random Access Memories) each constructed of one MOS (Metal Oxide Semiconductor) transistor and one capacitor are mainly manufactured. With demands for high integration and fine processability in recent years, it has become more and more difficult to secure the cell capacity in the DRAMs having such a construction. Therefore, generally, efforts are made to develop methods of increasing the area of an electrode to secure the cell capacity. More specifically, the area of the electrode is increased by constructing the electrode in a three-dimensional structure. However, because this method causes the manufacturing process to be very complicated, attempts to increase the area of the electrode by this method have almost reached the limit. Further, thinning of the dielectric itself has almost reached the limit. Therefore, in order to secure the cell capacity, researches are being made to develop new methods of using an oxide having a high dielectric constant (hereinafter referred to as "high dielectric") such as $SrTiO_3$ or $(Ba, Sr)TiO_3$ as a dielectric material.

In the meantime, with the progress of a thin film forming technique, ferroelectric non-volatile memories (FeRAM) operating at a high density and at a high speed are being developed by combining the thin film technique and a semiconductor memory fabricating technique with each other. The researches of such ferroelectric non-volatile memories are energetically made for practical application because it is considered that due to their properties of high-speed write/read, operations at low voltages, and a high resistance to repeated write/read operations, the ferroelectric non-volatile memories will be able to replace not only the conventional non-volatile memories such as EPROMs (Erasable Programmable ROMs), EEPROMs (Electrically Erasable and Programmable ROMs), and flash memories, but also SRAMs (static RAMs) and DRAMs (Dynamic RAMs).

For ferroelectric materials, the following substances have been investigated: $PbZrTiO_3$ (hereinafter referred to as "PZT"), and $SrBi_2Ta_2O_9$ and $Bi_4Ti_3O_{12}$ which each have fatigue characteristics more favorable than the PZT and can be driven at low voltages. However, in order to allow these ferroelectrics and the high dielectrics to display their characteristics fully, it is necessary to heat-treat them in an ambient of oxidizing gas at a temperature of as high as 400° C.–800° C.

When forming highly integrated DRAMs or FeRAMs having a stack construction by using the ferroelectric or high dielectric material of the above-described kind, a plug formed of polysilicon (i.e., polycrystalline silicon) or the like is typically used to electrically connect a MOS section and a capacitor section with each other. FIG. 2 shows a cross-sectional view of a conventional semiconductor storage device having such a construction.

In FIG. 2, reference numeral 21 denotes a silicon substrate, reference numeral 22 denotes a gate electrode, reference numerals 23 and 24 denote a source region and a drain region, respectively, reference numeral 25 denotes a polysilicon plug, reference numeral 26 denotes a LOCOS (LOCal Oxidation of Silicon) oxide film, and reference numerals 27 and 31 denote interlaminar insulation films. Also, reference numerals 29, 30, and 32 respectively denote a lower electrode, a ferroelectric film, and an upper electrode of a capacitor section, and reference numeral 33 denotes a bit line.

The lower electrode 29 is formed of platinum (Pt), which material displays a high degree of resistance to oxidation during the film forming process at a high temperature. The barrier metal 28 is provided between the lower electrode 29 and the plug 25. The provision of the barrier metal 28 is necessary because the barrier metal 28 prevents Pt of the lower electrode 29 from reacting with silicon of the plug 5 and also prevents elements composing the ferroelectric film 30 (or a high dielectric film) from diffusing through the lower electrode 29 to other films during a heat-treating process. For the material of the barrier metal 28, TiN, for example, is known.

However, if the barrier metal is formed of TiN, TiN in the barrier metal is easily oxidized by oxygen included in an atmosphere and permeating through Pt of the lower electrode during the heat-treatment of the ferroelectric or high dielectric. Consequently, a volume change and a film stress occur, which results in separation of TiN of the barrier metal from Pt of the lower electrode and which will cause hillocks and cracks in Pt of the lower electrode. On the other hand, if $SrBi_2Ta_2O_{12}$ (SBT), which has a very good fatigue characteristic as compared with PZT, is used for a non-volatile memory, it is impossible to employ a combination of Pt and TiN because SBT requires a heat treatment at a higher temperature (700° C.) than PZT does.

It is also known to use PtRh in place of Pt as the lower electrode material (see JP-A-9-45872). This PtRh, however, does not sufficiently function as a barrier to oxygen, either.

SUMMARY OF THE INVENTION

An object of the present invention is to provide a semiconductor storage device having a structure which offers a sufficient barrier to oxygen during a heat treatment even in a high-temperature oxidizing atmosphere and therefore provides a good ohmic characteristic.

In order to accomplish the above object, the present invention provides a semiconductor storage device comprising:

a capacitor section having a lower electrode, a dielectric film, and an upper electrode stacked in this order;

a MOS transistor having a source region, a drain region, and a gate electrode;

a plug for electrically connecting the capacitor section with the drain region of the MOS transistor; and a barrier metal formed between the lower electrode of the capacitor section and the plug, wherein the lower electrode of the capacitor section has a plurality of films including a platinum-rhodium alloy oxide film which is formed in contact with the dielectric film.

With this arrangement, in a thermal process for forming the dielectric film in an oxidizing gas ambient, the platinum-rhodium alloy oxide film prevents oxygen from penetrating the lower electrode into the barrier metal. Therefore, oxidization of the barrier metal is suppressed, and the drawbacks caused by the oxidization of the barrier metal, such as separation between the lower electrode and the barrier metal, hillocks and cracks in the lower electrode, and so on, are prevented from occurring. As a result, the semiconductor storage device has a good contact between the capacitor section and the MOS transistor.

In an embodiment, the lower electrode consists of the platinum-rhodium alloy oxide film and a metal film which is formed of either a platinum-rhodium alloy or platinum and is placed under the platinum-rhodium alloy oxide film.

An oxygen content of the platinum-rhodium alloy oxide is preferably between 2% and 30% inclusive.

In an embodiment, the platinum-rhodium alloy oxide film has a thickness of 100–800 Å inclusive and the metal film has a thickness of 100–1000 Å inclusive.

In an embodiment, the dielectric film is a ferroelectric film and the barrier metal is formed of one of TiN and $Ta_xSi_{1-x}N_y$ ($1>x>0.2$, $1 \geq y>0$).

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
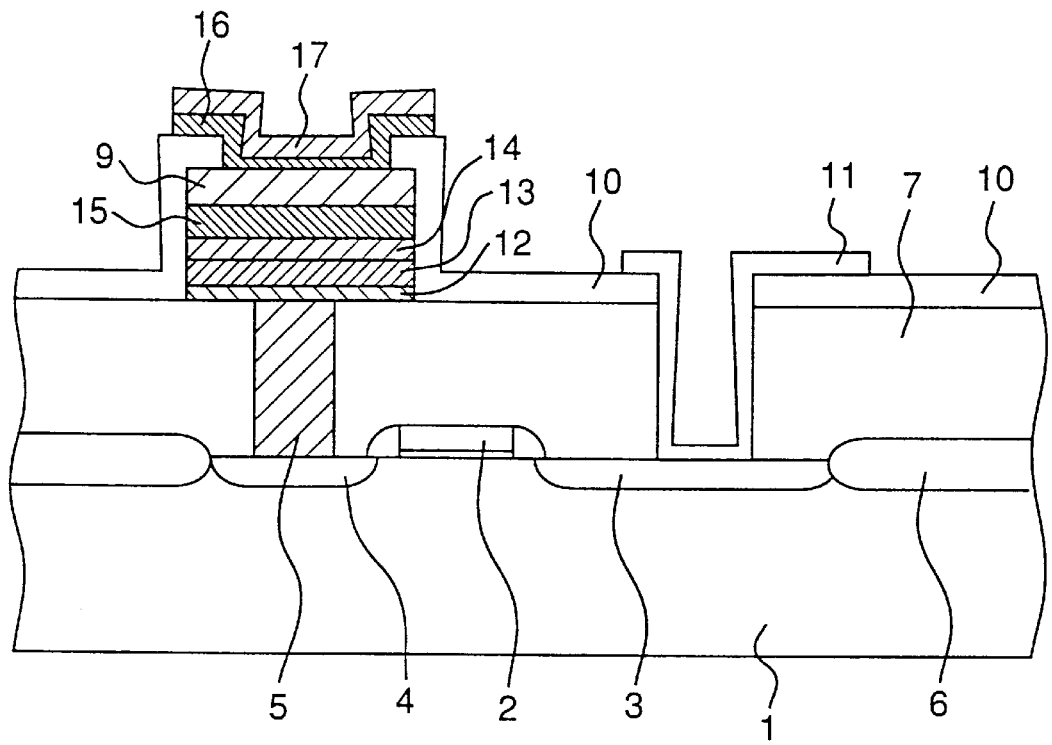
FIG. 1 is a cross sectional view of an embodiment of the semiconductor storage device according to the present invention, wherein only a capacitor section and a plug is hatched for the sake of simplicity.
Figure 2:
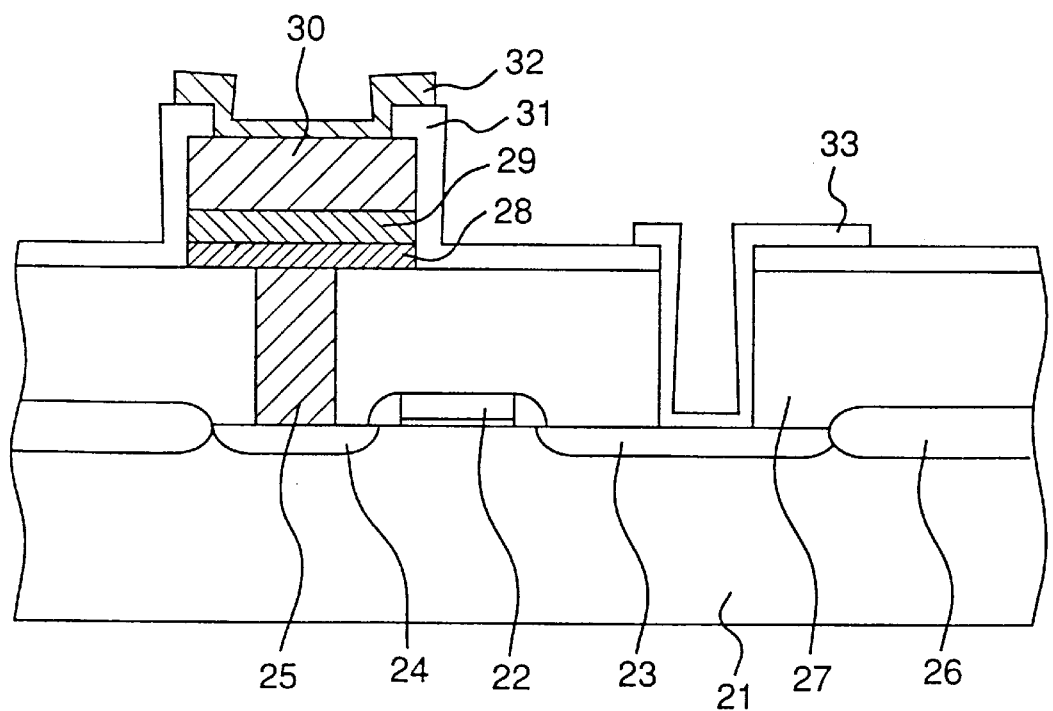
FIG. 2 is a cross sectional view of the prior art semiconductor storage device, wherein only a capacitor section and a plug is hatched for the sake of simplicity.

Referring now to FIG. 1 which is a cross sectional view showing a structure of a semiconductor storage device according to an embodiment of the invention, a MOS transistor having a gate electrode 2, a source region 3, and a drain region 4 is formed on a silicon substrate 1 and covered by a first interlaminar insulation film 7. Reference numeral 6 denotes a LOCOS (Local Oxidation of Silicon) oxide film. A polysilicon plug 5 connecting the MOS transistor with a capacitor section is formed in the first interlaminar insulation film 7.

The capacitor section has a lower electrode consisting of a first platinum-rhodium alloy (PtRh) film 14 and a first platinum-rhodium alloy oxide (PtRhOx) film 15, an upper electrode consisting of a second platinum-rhodium alloy oxide ($PtRhO_x$) film 16 and a second platinum-rhodium alloy (PtRh) film 17, and a ferroelectric thin film 9 formed between the first and second $PtRhO_x$ films 15 and 16 of the lower and upper electrodes. Between the polysilicon plug 5 and the lower electrode, there are a titanium nitride (TiN) film 13 as a barrier metal and an adhesion film 12 made of titanium (Ti). In FIG. 1 are also shown a second interlaminar insulation film 10 and a bit line 11. The second interlaminar insulation film 10 covers walls of the films 12, 13, 14, 15, and 9, and an upper surface of the first interlaminar insulation film 7.

The following describes how the above semiconductor storage device is formed.

First, the LOCOS oxide film 6 for element isolation is formed in a thickness of 5000 Å on the P-type silicon substrate 1. Then, by ion implantation, the source region 3 and the drain region 4 are formed. Then, the gate electrode 2 is formed.

Then, for the formation of the capacitor section having a stack structure, the first interlaminar insulation film 7 having a thickness of 5000 Å is formed by a CVD (chemical vapor deposition) method. Thereafter a contact hole having a diameter of 0.5 μm is formed in the first interlaminar insulation film 7.

Then, by the CVD method, polysilicon is deposited on the entire surface of the substrate so that the contact hole is filled with polysilicon. Then, the surface of the polysilicon is flattened by a chemical mechanical polishing (CMP) method. Thus, the polysilicon plug 5 for connecting the drain region 4 and the capacitor section is completed.

Then, the Ti film of a thickness of 200–300 Å is formed as the adhesion film on the polysilicon plug 5 at 200° C. by a DC magnetron sputtering method and subsequently to this the TiN film 13 as the barrier metal is formed to a thickness of about 2000 Å at 200° C. by a DC magnetron reactive sputtering method. These films are formed continuously. Then, the TiN film 13 is crystallized at 600° C. using a rapid thermal annealing (RTA) apparatus. If the barrier metal is not formed and the lower electrode is formed directly on the polysilicon plug, the element Pt in the lower electrode would react with the polysilicon during this heat treatment, resulting in a poor contact characteristic. If the ferroelectric film is of SBT, which requires a heat treatment at as high as 700° C., there will occur a problem of oxygen permeation or penetration.

Next, on the TiN film 13, the first PtRh film 14 is formed to a thickness of 100–1000 Å (preferably, about 200 Å) at 250° C. by a DC magnetron sputtering method, and then the first $PtRhO_x$ film 15 is formed to a thickness of 100–800 Å (preferably, about 800 Å) at 250° C. by a DC magnetron reactive sputtering method. Thus, the lower electrode is formed.

If the film thickness of the TiN film 13 is less than 2000 Å, the element Pt in the first PtRh film 14 tends to react with silicon. However, increasing the film thickness of the TiN film 13 to be far more than 2000 Å is not preferable because this in turn increases the overall film thickness of the capacitor section. Therefore, the film thickness of the TiN film 13 is preferably about 2000 Å.

If the film thickness of the first PtRh film 14 is less than 100 Å, an oxygen gas atmosphere penetrates the first PtRh film 14 during the later process of forming the ferroelectric film. As a result, the TiN film 13 is oxidized, resulting in obtainment of a poor contact characteristic. On the other hand, if the PtRh film 14 has a film thickness of larger than 1000 Å, the total film thickness of the capacitor section inconveniently increases, which is unpreferable.

Also, if the film thickness of the first $PtRhO_x$ film 15 is less than 100 Å, an oxygen gas passes through the first $PtRhO_x$ film 17 during the process of forming the ferroelectric film. As a result, the TiN film 13 is oxidized, resulting in obtainment of a poor contact characteristic. On the other hand, if the film thickness of the $PtRhO_x$ film 14 is larger than 800 Å, this inconveniently increases the total film thickness of the capacitor section, which is unpreferable.

The ratio between the elements of the first PtRh film 14 thus formed is Pt:Rh=90:10. If percentage of an oxygen content in the $PtRhO_x$ film is over 30% the morphology of the $PtRhO_x$ film becomes unfavorable rapidly and thus the crystallizability of the ferroelectric thin film formed thereon becomes unfavorable. As a result, the leakage current characteristic of the capacitor section becomes very bad. If the percentage of the oxygen content is below 2%, the oxygen gas atmosphere used in forming the ferroelectric thin film permeates through the $PtRhO_x$ film, thus oxidizing the polysilicon and preventing a preferable contact between the MOS transistor section and the capacitor section from being obtained.

After having formed the lower electrode in the above manner, an SBT ($SrBi_2Ta_2O_9$) film is formed as the ferroelectric thin film 9 by the metal organic decomposition (MOD) process. In the MOD process, a first baking or calcination is performed at 600° C. for 30 minutes in an ambient of oxygen under the atmospheric pressure. Thereafter, a silicon oxide film is formed as the second interlaminar insulation film 10 by the CVD method. A hole is processed in the silicon oxide film in a position corresponding to an upper portion of the capacitor section by the dry etching method. Then, the upper electrode is formed. Specifically, the second $PtRhO_x$ film 16 is formed to a thickness of 100–800 Å (preferably, about 800 Å) at 250° C. by the DC magnetron reactive sputtering method and then the second PtRh film 17 is formed to a thickness of 100–1000 Å (preferably, about 200 Å) at 250° C. by the DC magnetron sputtering method. The thus formed upper electrode is processed into a desired size. Then, a heat treatment as a second calcination process is performed at 750° C. for 30 minutes in an ambient of oxygen under the atmospheric pressure.

Finally, a contact hole leading to the source region 3 of the MOS transistor is formed through the first and second interlaminar insulation films 7 and 10, an aluminum film is then formed by the sputtering method, and the aluminum film thus formed is processed by the dry etching method. As a result, the bit line 11 is formed.

Figure 3:
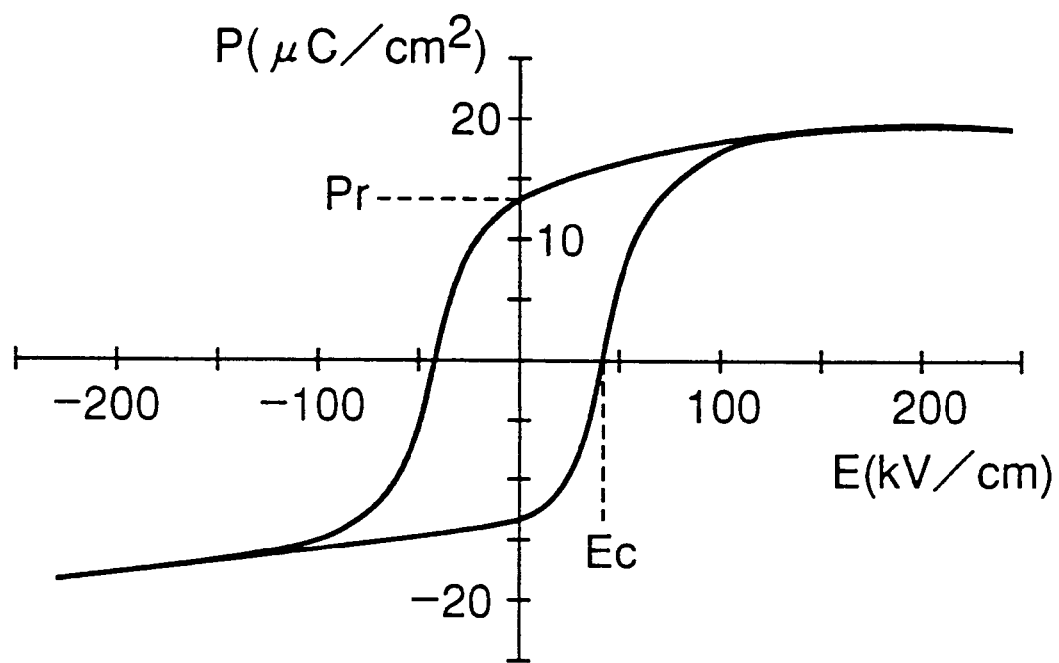
FIG. 3 is a graph showing a ferroelectric characteristic of the semiconductor storage device of FIG. 1.

The ferroelectric characteristics of the capacitor formed by the above method were examined. As a result, a hysteresis loop, as shown in FIG. 3, with Pr (a remanent polarization value)=13 $\mu C/cm^2$ and Ec (coercive electric field)=40 kV/cm was obtained. The hysteresis loop has a good symmetry, which proves that the polysilicon plug and the barrier metal and lower electrode contact each other closely and that a good ohmic characteristic was obtained. Furthermore, fatigue characteristics caused by polarization-inversion were measured through application of a stress pulse having a frequency of 100 kHz, a duty ratio of 5%, and a voltage of 5 V. The result was that the remanent polarization value Pr after $10^{11}$ cycles was 97% of an initial polarization value. That is, assuming the initial polarization value to be one ("1"), the remanent polarization value changed by only 0.03 relative to the initial value even after the $10^{11}$ cycles of stress pulse application. This indicates that the semiconductor storage device has a considerably good fatigue characteristic.

In the above embodiment TiN is used as the barrier metal. Alternatively, a tantalum-silicon alloy nitride ($Ta_xSi_{1-x}N_y$) having a similar performance as a barrier may be used. When $Ta_xSi_{1-x}N_y$ was used, similar effects were obtained. Composition of $Ta_xSi_{1-x}N_y$ is, preferably, such that 1>x>0.2 and 1≧y>0.

Also, the capacitor section may be formed on the silicon substrate without forming a plug. In this case also, as far as the lower electrode of the capacitor section has a platinum-rhodium alloy oxide film in contact with the ferroelectric film and the barrier metal is provided between the lower electrode and the silicon substrate, similar effects to those described above can be obtained.

Furthermore, in the above embodiment, the ferroelectric characteristic (hysteresis) has symmetry because of the symmetrical film arrangement of the upper and lower electrodes. However, as far as the symmetry of the hysteresis is maintained, conventionally used electrode materials such as Pt may be used for the upper electrode films or the lower electrode films other than the first $PtRhO_x$ film 14.

Furthermore, although the lower and upper electrodes each have two films in the above embodiment, more films may be formed.

As obvious from the above, according to the present invention, because the lower electrode includes a $PtRhO_x$ film in contact with the dielectric film, the barrier metal surface is prevented from being oxidized even during the heat treatment at as high as about 750° C. in an ambient of oxidizing gas. Also, a reaction between the element Si of the plug and the element Pt of the lower electrode is suppressed. As a result, a semiconductor storage device having a good ohmic contact characteristic is obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device, comprising:
    a capacitor section having a lower electrode, a dielectric film, and an upper electrode stacked in this order;
    a MOS transistor having a source region, a drain region, and a gate electrode;
    a polysilicon plug for electrically connecting the capacitor section with the drain region of the MOS transistor; and
    a barrier metal formed between the lower electrode of the capacitor section and the plug,
    wherein the barrier metal is formed of either TiN or $Ta_xSi_{1-x}N_y$ (1>x>0.2, 1≧y>0), and
    wherein the lower electrode of the capacitor section has a plurality of films including a platinum-rhodium alloy oxide film which is formed in contact with the dielectric film.

2. The semiconductor storage device according to claim 1, wherein the lower electrode consists of the platinum-rhodium alloy oxide film and a metal film which is formed of either a platinum-rhodium alloy or platinum and is placed under the platinum-rhodium alloy oxide film.

3. The semiconductor storage device according to claim 2, wherein the platinum-rhodium alloy oxide film has a thickness of 100–800 Å inclusive and the metal film has a thickness of 100–1000 Å inclusive.

4. The semiconductor storage device according to claim 1, wherein an oxygen content of the platinum-rhodium alloy oxide is between 2% and 30% inclusive.

5. A semiconductor storage device, comprising:
    a capacitor section having a lower electrode, a dielectric film, and an upper electrode stacked in this order;
    a MOS transistor having a first current terminal region, a second current terminal region, and a gate electrode;
    a polysilicon plug for electrically connecting the capacitor section with the first current terminal region of the MOS transistor; and
    a barrier metal formed between the lower electrode of the capacitor and the plug,
    wherein the barrier metal is formed of either TiN or $Ta_xSi_{1-x}N_y$ (1>x>0.2, 1≧y>0),
    wherein the lower electrode of the capacitor section has a plurality of films including a platinum-rhodium oxide film which is formed in contact with the dielectric film, and wherein the dielectric film is an SBT film.

6. The semiconductor device according to claim 5, wherein the lower electrode consists of the platinum-rhodium alloy oxide film and a metal film which is formed of either a platinum-rhodium alloy or platinum and is placed under the platinum-rhodium alloy oxide film.

7. The semiconductor storage device according to claim 5, wherein the platinum-rhodium alloy oxide film has a thickness of 100–800 Å inclusive and the metal film has a thickness of 100–1000 Å inclusive.

8. The semiconductor device according to claim 5, wherein an oxygen content of the platinum-rhodium alloy oxide is between 2% and 30% inclusive.

* * * * *